(12) United States Patent
Kitamura

(10) Patent No.: US 11,075,114 B2
(45) Date of Patent: Jul. 27, 2021

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventor: Masahito Kitamura, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/555,178

(22) Filed: Aug. 29, 2019

(65) Prior Publication Data

US 2020/0083097 A1 Mar. 12, 2020

(30) Foreign Application Priority Data

Sep. 12, 2018 (JP) .............................. JP2018-170681

(51) Int. Cl.
  *H01L 21/768* (2006.01)
  *H01L 21/02* (2006.01)
  *H01L 21/67* (2006.01)
(52) U.S. Cl.
  CPC .. *H01L 21/76876* (2013.01); *H01L 21/02164* (2013.01); *H01L 21/67248* (2013.01); *H01L 21/67253* (2013.01)
(58) Field of Classification Search
  None
  See application file for complete search history.

(56) References Cited

U.S. PATENT DOCUMENTS

| | | |
|---|---|---|
| 5,344,796 A | 9/1994 | Shin et al. |
| 5,582,640 A | 12/1996 | Okada et al. |
| 2004/0067631 A1 | 4/2004 | Bu et al. |
| 2008/0017101 A1 | 1/2008 | Bauer et al. |
| 2010/0112792 A1 | 5/2010 | De Souza et al. |
| 2013/0084693 A1 | 4/2013 | Kakimoto et al. |
| 2013/0149846 A1 | 6/2013 | Koshi et al. |
| 2014/0080321 A1 | 3/2014 | Hirose et al. |
| 2014/0187024 A1 | 7/2014 | Obu et al. |

(Continued)

FOREIGN PATENT DOCUMENTS

| | | |
|---|---|---|
| JP | 06-204137 A2 | 7/1994 |
| JP | 2004-289168 A | 10/2004 |

(Continued)

OTHER PUBLICATIONS

Singaporean Search Report dated Mar. 10, 2020 for the Singaporean Patent Application No. 10201907969Q.

(Continued)

*Primary Examiner* — Asok K Sarkar
(74) *Attorney, Agent, or Firm* — Volpe Koenig

(57) ABSTRACT

There is provided a technique which includes (a) forming a seed layer on a substrate by supplying a first process gas to the substrate at a first temperature, (b) forming a film on the seed layer by supplying a second process gas to the substrate at a second temperature, and (c) annealing the seed layer and the film at a third temperature, wherein at least one selected from the group of a crystal grain size and a surface roughness of the film after performing the annealing in (c) is adjusted by controlling a thickness of the seed layer formed in (a).

19 Claims, 6 Drawing Sheets

(56) References Cited

U.S. PATENT DOCUMENTS

| | | | |
|---|---|---|---|
| 2015/0287594 A1* | 10/2015 | Hirose | C23C 16/0272 438/478 |
| 2017/0186604 A1 | 6/2017 | Orihashi et al. | |
| 2017/0221699 A1 | 8/2017 | Orihashi et al. | |

FOREIGN PATENT DOCUMENTS

| | | |
|---|---|---|
| JP | 2007-013194 A | 1/2007 |
| JP | 2013-197307 A | 9/2013 |
| JP | 2014-060227 A | 4/2014 |
| JP | 2014-067796 A | 4/2014 |
| JP | 2016-184754 A | 10/2016 |
| KR | 10-2017-0091049 A | 8/2017 |
| WO | 2012/029661 A1 | 3/2012 |

OTHER PUBLICATIONS

Singaporean Written Opinion dated Mar. 13, 2020 for the Singaporean Patent Application No. 10201907969Q.
Korean Office Action dated Sep. 22, 2020 for Korean Patent Application No. 10-2019-0107242.
Japanese Office Action dated Mar. 9, 2021 for Japanese Patent Application No. 2018-170681.

\* cited by examiner

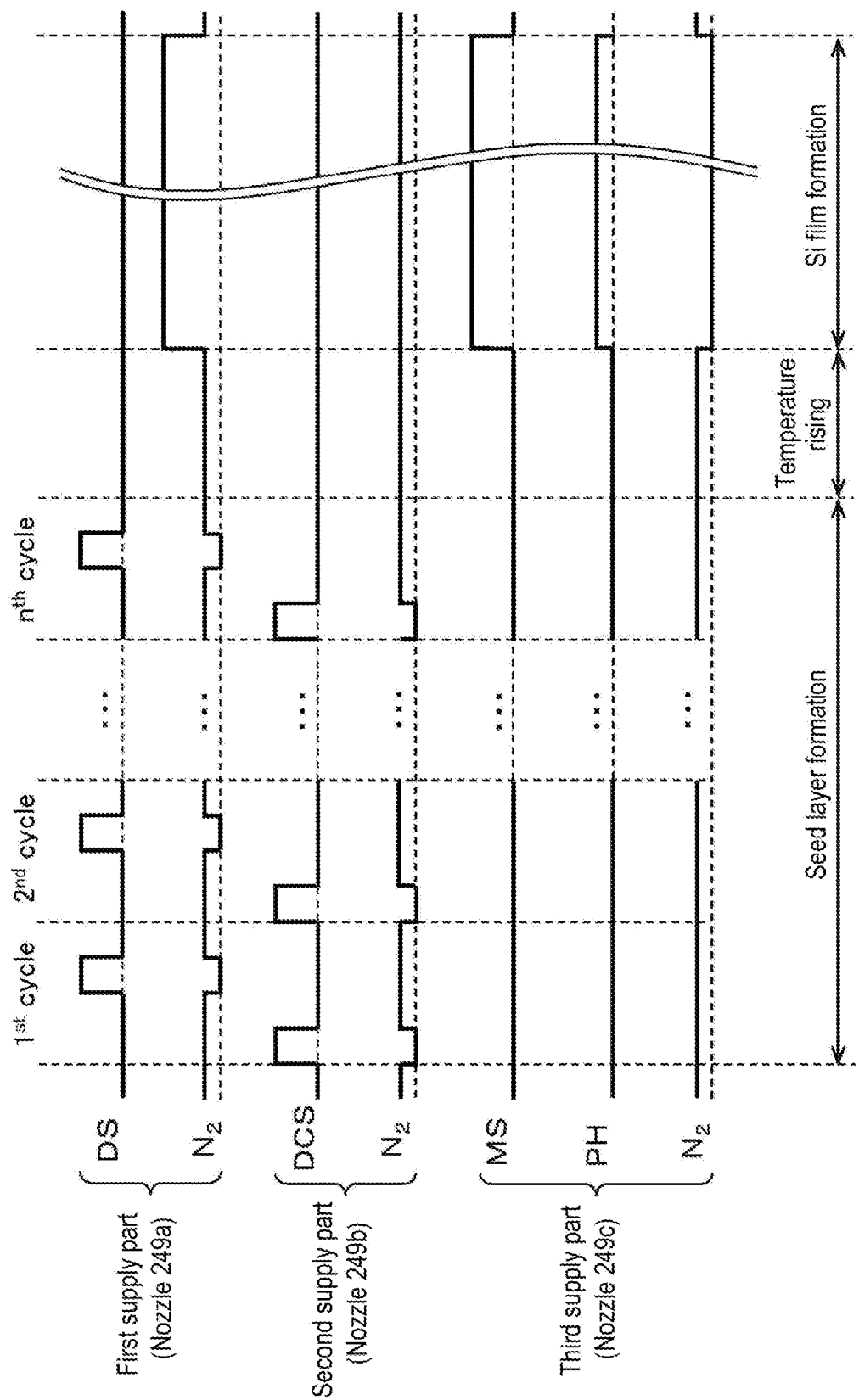

US 11,075,114 B2

METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is based upon and claims the benefit of priority from Japanese Patent Application No. 2018-170681, filed on Sep. 12, 2018, the entire contents of which are incorporated herein by reference.

TECHNICAL FIELD

The present disclosure relates to a method of manufacturing a semiconductor device, a substrate processing apparatus, and a recording medium.

BACKGROUND

As an example of a process of manufacturing a semiconductor device, a process of forming a film on a substrate is often carried out.

SUMMARY

The present disclosure provides some embodiments of a technique capable of adjusting a quality of a film formed on a substrate.

According to one embodiment of the present disclosure, there is provided a technique which includes (a) forming a seed layer on a substrate by supplying a first process gas to the substrate at a first temperature, (b) forming a film on the seed layer by supplying a second process gas to the substrate at a second temperature, and (c) annealing the seed layer and the film at a third temperature, wherein at least one selected from the group of a crystal grain size and a surface roughness of the film after performing the annealing in (c) is adjusted by controlling a thickness of the seed layer formed in (a).

BRIEF DESCRIPTION OF DRAWINGS

FIG. 4 is a diagram illustrating a film-forming sequence according to an embodiment of the present disclosure.

DETAILED DESCRIPTION

One Embodiment of the Present Disclosure

An embodiment of the present disclosure will now be described with reference to FIGS. 1 to 4.

(1) Configuration of the Substrate Processing Apparatus

Figure 1:
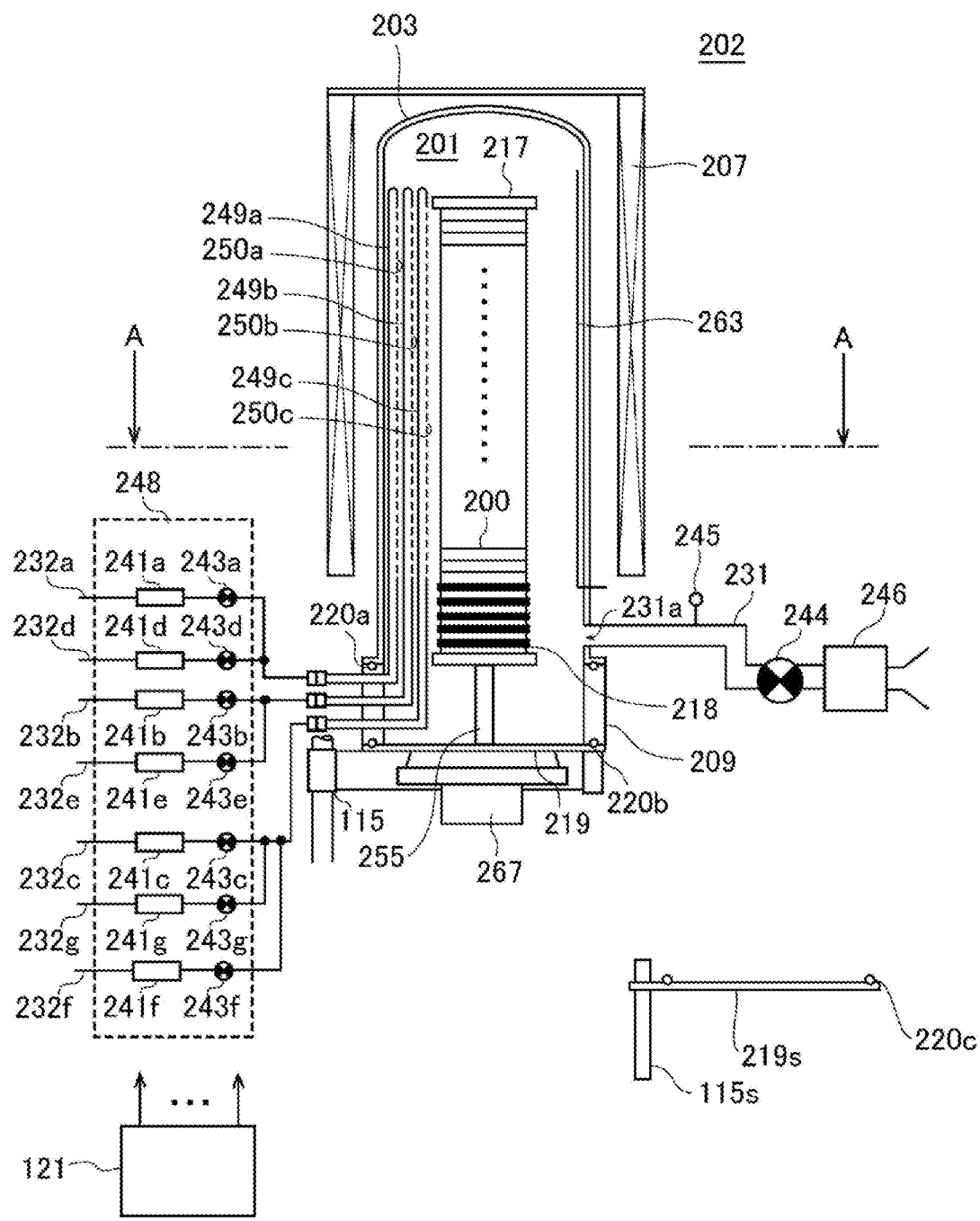
FIG. 1 is a schematic configuration diagram of a vertical type process furnace of a substrate processing apparatus suitably used in an embodiment of the present disclosure, in which a portion of the process furnace is shown in a vertical cross sectional view.

As illustrated in FIG. 1, a process furnace 202 includes a heater 207 as a heating mechanism (temperature regulation part). The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material such as, e.g., stainless steel (SUS) or the like, and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A process container (reaction container) is mainly configured by the reaction tube 203 and the manifold 209. A process chamber 201 is formed in a hollow cylindrical portion of the process container. The process chamber 201 is configured to accommodate wafers 200 as substrates. A process is performed upon the wafers 200 in the process chamber 201.

Nozzles 249a 249c as first to third supply parts are installed in the process chamber 201 so as to penetrate a sidewall of the manifold 209. The nozzles 249a to 249c will be referred to as first to third nozzles. The nozzles 249a to 249c are each made of a heat resistant material such as, e.g., quartz or SiC. Gas supply pipes 232a to 232c are respectively connected to the nozzles 249a to 249c. The nozzles 249a to 249c are different nozzles from each other and each of the nozzles 249a and 249c is installed adjacent to the nozzle 249b.

Mass flow controllers (MFCs) 241a to 241c as flow rate controllers (flow rate control parts) and valves 243a to 243c as opening/closing valves are installed at the gas supply pipes 232a to 232c sequentially from the upstream sides of gas flow, respectively. Gas supply pipes 232d and 232e are connected to the gas supply pipes 232a and 232b, respectively, at the downstream side of the valves 243a and 243b. Gas supply pipes 232f and 232g are connected to the gas supply pipe 232c at the downstream side of the valve 243c. MFCs 241d to 241g and valves 243d and 243g are respectively installed at the gas supply pipes 232d to 232g sequentially from the upstream sides of gas flow. The gas supply pipes 232a to 232g are each made of a metal material such as, e.g., stainless steel (SUS) or the like.

Figure 2:
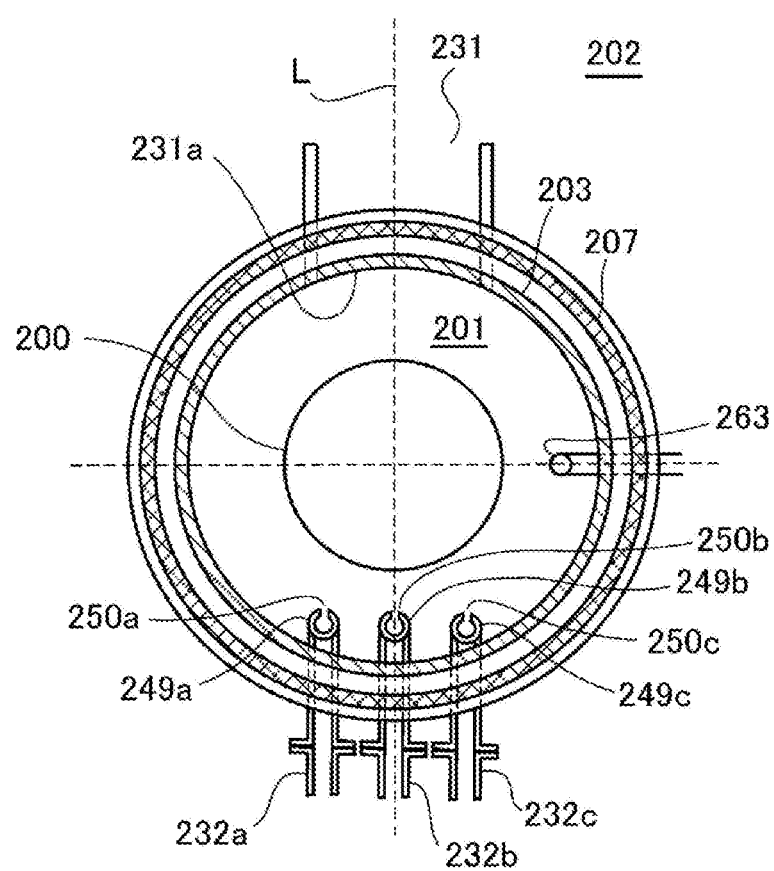
FIG. 2 is a schematic configuration view of part of the vertical process furnace of the substrate processing apparatus suitably used in an embodiment of the present disclosure, in which a portion of the process furnace is shown in a cross sectional view taken along line A-A in FIG. 1.

As illustrated in FIG. 2, the nozzles 249a to 249c are installed at a space with an annular plan-view shape between the inner wall of the reaction tube 203 and the wafers 200 such that the nozzles 249a to 249c extend upward along an arrangement direction of the wafers 200 from a lower portion of the inner wall of the reaction tube 203 to an upper portion of the inner wall of the reaction tube 203. Specifically, the nozzles 249a to 249c are installed at a lateral side of a wafer arrangement region in which the wafers 200 are arranged, namely in a region which horizontally surrounds the wafer arrangement region, so as to extend along the wafer arrangement region. The nozzle 249b is disposed so as to face an exhaust port 231a to be described later on a straight line in a plan view with the centers of the wafers 200 loaded into the process chamber 201 interposed therebetween. The nozzles 249a and 249c are disposed so as to sandwich a straight line L passing through the nozzle 249b and the center of the exhaust port 231a between both sides along the inner wall of the reaction tube 203 (outer peripheral portion of the wafers 200). The straight line L is also a straight line passing through the nozzle 249b and the center of the wafers 200. That is, it can be said that the nozzle 249c is installed at the opposite side of the nozzle 249a with the straight line L interposed therebetween. The nozzles 249a and 249c are disposed in line symmetry with the straight line L as an axis of symmetry. Gas supply holes 250a to 250c for supplying a gas are installed on the side surfaces of the nozzles 249a to 249c, respectively. The gas supply holes 250a to 250c are opened to face the exhaust port 231a, as viewed from the plane, so as to allow a gas to be supplied toward the wafers 200. The gas supply holes 250a to 250c may be formed in a plural number between the lower portion of the reaction tube 203 and the upper portion of the reaction tube 203.

As a process gas (first process gas), for example, a silane-based gas (first silane-based gas) containing silicon (Si) as a main element constituting a silicon seed layer to be described later, which is formed on each of the wafers 200, is supplied from the gas supply pipe 232a into the process chamber 201 via the MFC 241a, the valve 243a, and the nozzle 249a. As the first silane-based gas, it may be possible to use a halogen-element-free silicon hydride gas (first silicon hydride gas), for example, a disilane ($Si_2H_6$, abbreviation: DS) gas.

As a process gas (halogen-containing gas), for example, a gas containing Si and a halogen element, i.e., a halosilane gas, is supplied from the gas supply pipe 232b into the process chamber 201 via the MFC 241b, the valve 243b, and the nozzle 249b. The halogen element includes chlorine (CO, fluorine (F), bromine (Br), iodine (I), and the like. As the halosilane gas, it may be possible to use, for example, a chlorosilane gas containing Si and Cl, for example, a dichlorosilane ($SiH_2Cl_2$, abbreviation: DCS) gas.

As a process gas (second process gas), for example, a silane-based gas (second silane-based gas) containing Si as a main element constituting a film formed on each of the wafers 200, is supplied from the gas supply pipe 232c into the process chamber 201 via the MFC 241c, the valve 243c, and the nozzle 249c. As the second silane-based gas, it may be possible to use a halogen-element-free silicon hydride gas (second silicon hydride gas), for example, a monosilane ($SiH_4$, abbreviation: MS) gas.

As an inert gas, for example, a nitrogen ($N_2$) gas is supplied from the gas supply pipes 232d to 232f into the process chamber 201 via the MFCs 241d to 241f, the valves 243d to 243f, the gas supply pipes 232a to 232c, and the nozzles 249a to 249c. The $N_2$ gas acts as a purge gas, a carrier gas, a dilution gas, or the like.

As a dopant gas, for example, a gas containing an impurity (dopant) is supplied from the gas supply pipe 232g into the process chamber 201 via the MFC 241g, the valve 243g, the gas supply pipe 232c, and the nozzle 249c. As the dopant gas, it may be possible to use a phosphine ($PH_3$, abbreviation: PH) gas which is a gas containing one of a group III element (group 13 element) and a group V element (group 15 element), for example, the group V element.

A first process gas supply system is mainly configured by the gas supply pipe 232a, the MFC 241a, and the valve 243a. A halogen-containing gas supply system is mainly configured by the gas supply pipe 232b, the MFC 241b, and the valve 243b. A second process gas supply system is mainly configured by the gas supply pipe 232c, the MFC 241c, and the valve 243c. A dopant gas supply system is mainly configured by the gas supply pipe 232g, the MFC 241g, and the valve 243g. The dopant gas supply system may be regarded as being included in the second process gas supply system. An inert gas supply system is mainly configured by the gas supply pipes 232d to 232f, the MFCs 241d to 241f, and the valves 243d to 243f.

One or all of various supply systems described above may be configured as an integrated supply system 248 in which the valves 243a to 243g, the MFCs 241a to 241g, and the like are integrated. The integrated supply system 248 is connected to each of the gas supply pipes 232a to 232g so that a supply operation of various kinds of gases into the gas supply pipes 232a to 232g, i.e., an opening/closing operation of the valves 243a to 243g, a flow rate adjusting operation by the MFCs 241a to 241g or the like, is controlled by a controller 121 which will be described later. The integrated supply system 248 is configured as an integral type or division type integrated unit, and is also configured so that it is detachable from the gas supply pipes 232a to 232g or the like, so as to perform maintenance, replacement, expansion or the like of the integrated supply system 248, on an integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (gas supply holes 250a to 250c) with the wafers 200 interposed therebetween, as viewed from the plane. The exhaust port 231a may be installed between a lower portion of the sidewall of the reaction tube 203 and an upper portion of the sidewall of the reaction tube 203, i.e., along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust of the interior of the process chamber 201 and a vacuum exhaust stop can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system is mainly configured by the exhaust pipe 231, the APC valve 244 and the pressure sensor 245. The vacuum pump 246 may be regarded as being included in the exhaust system.

A seal cap 219, which serves as a furnace opening cover configured to hermetically seal a lower end opening of the manifold 209, is installed under the manifold 209. The seal cap 219 is made of a metal material such as, e.g., stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 215 is configured as a transfer device (transfer mechanism) which loads and unloads (transfers) the wafers 210 into and from (out of) the process chamber 201 by moving the seal cap 219 up and down. A shutter 219s serving as a furnace opening cover capable of hermetically seal the lower end opening of the manifold 209 in a state of unloading the boat 217 from the interior of the process chamber 201 by moving the seal cap 219 down, is installed under the manifold 209. The shutter 219s is made of a metal material such as, e.g., stainless steel or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
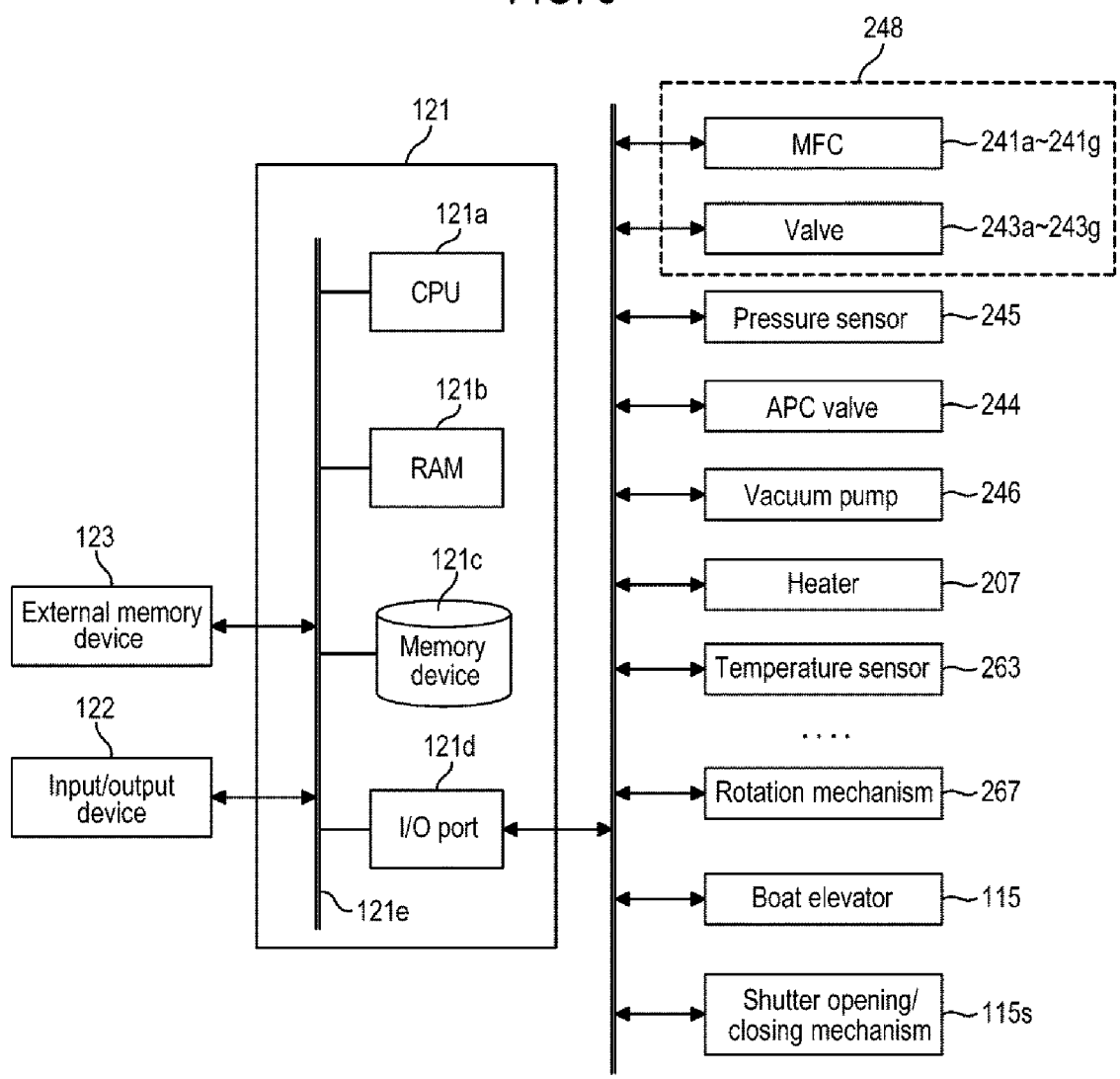
FIG. 3 is a schematic configuration diagram of a controller of the substrate processing apparatus suitably used in an embodiment of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in the substrate processing, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data or the like read by the CPU 121a is temporarily stored.

The I/O port 121d is connected to the MFCs 241a to 241g, the valves 243a to 243g, the pressure sensor 245, the APC valve 244, the vacuum pump 246, the temperature sensor 263, the heater 207, the rotation mechanism 267, the boat elevator 115, the shutter opening/closing mechanism 115s, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241g, the opening/closing operation of the valves 243a to 243g, the opening/closing operation of the APC valve 244, the pressure regulating operation performed by the APC valve 244 based on the pressure sensor 245, the driving and stopping of the vacuum pump 246, the temperature regulating operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing

A substrate processing sequence example of forming a film on a wafer 200 as a substrate and then annealing the film using the aforementioned substrate processing apparatus, which is one of the processes for manufacturing a semiconductor device, will be described mainly with reference to FIG. 4. In the following descriptions, the operations of the respective parts constituting the substrate processing apparatus are controlled by the controller 121.

In the substrate processing sequence of the present embodiment, there are performed:

a step (seed layer-forming step) of forming a silicon seed layer (hereinafter, a Si seed layer) on a wafer 200 by supplying a DS gas as a first process gas to the wafer 200 at a first temperature;

a step (Si film-forming step) of forming a silicon film (hereinafter, a Si film) on the Si seed layer by supplying an MS gas as a second process gas to the wafer 200 at a second temperature; and a step (annealing step) of annealing the Si seed layer and the Si film at a third temperature, wherein at least one selected from the group of a crystal grain size and a surface roughness of the Si film after the annealing at the annealing step is adjusted by controlling a thickness of the Si seed layer formed at the seed layer-forming step. FIG. 4 illustrates a series of steps from the seed layer-forming step to the Si film-forming step.

At the seed layer-forming step illustrated in FIG. 4, the Si seed layer is formed by performing a cycle a predetermined number of times (n times, where n is an integer of 1 or more), the cycle including non-simultaneously performing: step 1 of supplying a DCS gas as a halogen-containing gas to the wafer 200; and step 2 of supplying a DS gas to the wafer 200.

Furthermore, at the Si film-forming step illustrated in FIG. 4, the Si film formed on the wafer 200 by supplying a PH gas as a dopant gas to the wafer 200 together with the MS gas will be referred to a Si film added (doped) with P, i.e., a P-doped Si film. In the present disclosure, the P-doped Si film will be simply referred to as the Si film.

In the present disclosure, for the sake of convenience, the aforementioned substrate processing sequence may sometimes be denoted as follows. The same denotation will be used in the modifications and the like as described hereinbelow.

(DCS→DS)×n→MS+PH→ANL⇒P-doped Si/Si seed

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

Wafer Charging and Boat Loading

If a plurality of wafers 200 is charged on the boat 217 (wafer charging), the shutter 219s may be moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

Pressure Regulation and Temperature Regulation

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired process temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the interior of the process chamber 201 and the heating and rotation of the wafers 200 may be all continuously performed at least until the process upon the wafers 200 is completed.

Seed Layer-Forming Step

Next, the following steps 1 and 2 are sequentially performed.

Step 1

At this step, a DCS gas is supplied to the wafer 200 in the process chamber 201.

Specifically, the valve 243b is opened to allow a DCS gas to flow through the gas supply pipe 232b. The flow rate of the DCS gas is adjusted by the MFC 241b. The DCS gas is supplied into the process chamber 201 via the nozzle 249b and is exhausted from the exhaust port 231a. At this time, the DCS gas is supplied to the wafer 200 (DCS gas supply step). Simultaneously, the valves 243d and 243f are opened to supply an $N_2$ gas into the process chamber 201 via the respective nozzles 249a and 249c.

By supplying the DCS gas to the wafer 200 under processing conditions as described hereinafter, a natural oxide film or an impurity can be removed from the surface of the wafer 200 by a treatment action (etching action) of the DCS gas and the surface can be cleaned. Thus, it is possible to allow the surface of the wafer 200 to become a surface on which adsorption of Si, i.e., formation of a Si seed layer, is likely to proceed at step 2 to be described later.

After the surface of the wafer 200 is cleaned, the valve 243b is closed to stop the supply of the DCS gas into the process chamber 201. Then, the interior of the process chamber 201 is vacuum-exhausted and the gas or the like, which remains within the process chamber 201, is removed from the interior of the process chamber 201. At this time, the valves 243d to 243f are opened to supply an $N_2$ gas into the process chamber 201 via the nozzles 249a to 249c. The $N_2$ gas supplied from the nozzles 249a to 249c acts as a purge gas. Thus, the interior of the process chamber 201 is purged (purge step).

Step 2

After step 1 is completed, a DS gas is supplied to the wafer 200 in the process chamber 201, i.e., the cleaned surface of the wafer 200.

Specifically, the valve 243a is opened to allow a DS gas to flow through the gas supply pipe 232a. The flow rate of the DS gas is adjusted by the MFC 241a. The DS gas is supplied into the process chamber 201 via the nozzle 249a and is exhausted from the exhaust port 231a. At this time, the DS gas is supplied to the wafer 200 (DS gas supply step). Further, at this time, the valves 243e and 243f are opened to supply an $N_2$ gas into the process chamber 201 via the respective nozzles 249b and 249c.

By supplying the DS gas to the wafer 200 under processing conditions to be described later, the DS gas can be gas-phase decomposed and Si contained in DS can be adsorbed on the surface of the wafer 200 cleaned at step 1 to form seed (nuclei). Under the processing conditions to be described later, the crystal structure of the nuclei formed on the surface of the wafer 200 becomes amorphous.

After the nuclei are formed on the surface of the wafer 200, the valve 243a is closed to stop the supply of the DS gas into the process chamber 201. Then, the gas or the like, which remains in the process chamber 201, is removed from the interior of the process chamber 201 according to the same processing procedures as those of the purge step of step 1.

Performing a Predetermined Number of Times

A seed layer in which the nuclei described above are densely formed on the wafer 200, i.e., a Si seed layer, can be formed by performing a cycle a predetermined number of times (n times, where n is an integer of 1 or more), the cycle including alternately, i.e., non-synchronously and non-simultaneously performing the aforementioned steps 1 and 2. The crystal structure of the Si seed layer formed on the wafer 200 becomes amorphous.

By controlling at least one selected from the group of a process temperature and a process time (a DCS gas supply time and a DS gas supply time) described below at the seed layer-forming step, it is possible to control the thickness of the Si seed layer formed on the wafer 200. Furthermore, by controlling the number of executions of the aforementioned cycle (cycle number) at the seed layer-forming step, it is also possible to control the thickness of the Si seed layer formed on the wafer 200. For example, by changing the cycle number between 1 and 100 times, or between 3 and 15 times, it is possible to control the thickness of the Si seed layer to between 0.1 and 10 nm, specifically between 0.4 and 3 nm.

An example of the processing conditions at step 1 is as follows:
DCS gas supply flow rate: 10 to 1,000 sccm
Supply time of DCS gas: 0.5 to 10 minutes
$N_2$ gas supply flow rate (per gas supply pipe): 10 to 10,000 sccm
Process temperature (first temperature): 350 to 440 degrees C.
Process pressure: 100 to 1,000 Pa.

An example of the processing conditions at step 2 is as follows:
DS gas supply flow rate: 10 to 1,000 sccm
Supply time of DS gas: 0.5 to 10 minutes.
Other processing conditions may be similar to the processing conditions of step 1.

Furthermore, the expression of the numerical range such as "350 to 440 degrees C." herein may mean that a lower limit value and an upper limit value are included in that range. Therefore, for example, "350 to 440 degrees C." may mean "350 degrees C. or higher and 440 degrees C. or lower". The same applies to other numerical ranges.

At step 1, as the halogen-containing gas, it may be possible to use, in addition to the DCS gas, a chlorosilane-based gas such as a monochlorosilane ($SiH_3Cl$, abbreviation: MCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas or the like. Furthermore, as the halogen-containing gas, it may be possible to use a tetrafluorosilane ($SiF_4$) gas, a tetrabromosilane ($SiBr_4$) gas, a tetraiodosilane ($SiI_4$) gas or the like. That is, as the halogen-containing gas, it may be possible to use, in addition to the chlorosilane-based gas, a halosilane gas such as a fluorosilane-based gas, a bromosilane-based gas, an iodosilane-based gas or the like. In addition, as the halogen-containing gas, it may be possible to use a Si-free halogen-based gas such as a hydrogen chloride (HCl) gas, a chlorine ($Cl_2$) gas, a trichloroborane ($BCl_3$) gas, a chlorine fluoride ($ClF_3$) gas or the like.

At step 2, as the first process gas, it may be possible to use, in addition to the DS gas, a silicon hydride gas such as a trisilane ($Si_3H_8$) gas, a tetrasilane ($Si_4H_{10}$) gas, a pentasilane ($Si_5H_{12}$) gas, a hexasilane ($Si_6H_{14}$) gas or the like. Furthermore, it is desirable that a silicon hydride gas of higher order than the second process gas used at the Si film-forming step to be described later be used as the first process gas.

As the inert gas, it may be possible to use, in addition to the $N_2$ gas, a rare gas such as an Ar gas, a He gas, a Ne gas, a Xe gas or the like. This also applies to a temperature-rising step, the Si film-forming step, the annealing step, and the like to be described later.

Temperature-Rising Step

After the Si seed layer is formed on the wafer 200, the output of the heater 207 is adjusted to change the internal temperature of the process chamber 201, i.e., the temperature of the wafer 200, to a second temperature higher than the first temperature described above. When performing this step, the valves 243d to 243f are opened to supply the $N_2$ gas into the process chamber 201 via the nozzles 249a to 249c, the gas is exhausted from the exhaust port 231a, and the interior of the process chamber 201 is purged. After the temperature of the wafer 200 reaches the second temperature and is stabilized, the Si film-forming step to be described later starts.

By performing this step, i.e., by raising the temperature of the wafer 200 to the second temperature higher than the first temperature and waiting until the temperature of the wafer 200 is stabilized, it is possible for polycrystallization of the Si seed layer formed on the wafer 200 to start. It is also possible to maintain the Si seed layer in an amorphous state according to the processing conditions (the second temperature and a waiting time) at this time.

Si Film-Forming Step

At this step, an MS gas and a PH gas are supplied to the wafer 200 in the process chamber 201, i.e., the surface of the Si seed layer formed on the wafer 200.

Specifically, the valve 243c is opened to allow an MS gas to flow through the gas supply pipe 232c. The flow rate of the MS gas is adjusted by the MFC 241c. The MS gas is supplied into the process chamber 201 via the nozzle 249c and is exhausted from the exhaust port 231a. At this time, the valve 243g is opened to allow a PH gas to flow through the gas supply pipe 232g. The flow rate of the PH gas is adjusted by the MFC 241g. The PH gas is supplied into the process chamber 201 via the gas supply pipe 232c and the nozzle 249c and is exhausted from the exhaust port 231a. At this time, the MS gas and the PH gas are supplied together and simultaneously to the wafer 200 (MS gas+PH gas supply step). At this time, the valves 243d and 243e are opened to supply the $N_2$ gas into the process chamber 201 via the respective nozzles 249a and 249b. Furthermore, at this time, as illustrated in FIG. 4, the balance between the flow rate of the $N_2$ gas supplied from the nozzle 249a and the flow rate of the $N_2$ gas supplied from the nozzle 249b may be controlled.

By supplying the MS gas and the PH gas to the wafer 200 under processing conditions to be described later and gas-phase decomposing at least the MS gas, it is possible to adsorb (deposit) Si on the surface of the wafer 200, i.e., the Si seed layer formed on the wafer 200 and to form a P-doped Si film. Under the processing conditions to be described later, the crystal structure of the Si film formed on the wafer 200 becomes amorphous.

Furthermore, when polycrystallization of the Si seed layer starts at the temperature-rising step by performing this step under the conditions to be described later, i.e., at the second temperature higher than the first temperature, it is possible for the polycrystallization to further proceed. In addition, when the Si seed layer is maintained in an amorphous state at the temperature-rising step, it is possible for the polycrystallization of the Si seed layer to start at this step. In any case, at least part of the Si seed layer can be polycrystallized, and the Si seed layer can be changed to be in a mixed amorphous—polycrystalline state or a polycrystalline state. Furthermore, when the Si seed layer is maintained in an amorphous state at the temperature-rising step, it is also possible to maintain the Si seed layer in an amorphous state according to the processing conditions (the second temperature and the gas supply time) at this step. However, the Si seed layer maintaining an amorphous state at a time when this step is completed becomes a state in which it is more easily polycrystallized than the Si film in an amorphous state formed thereon.

After the formation of the Si film in an amorphous state on the Si seed layer on the wafer 200 is completed, the valves 243c and 243g are closed to stop the supply of the MS gas and the PH gas into the process chamber 201. Then, the gas and the like, which remains in the process chamber 201, is removed from the interior of the process chamber 201 according to the same processing procedures as those of the purge step of step 1 described above.

An example of the processing conditions at the Si film-forming step is as follows:

MS gas supply flow rate: 10 to 5,000 sccm
PH gas supply flow rate: 0.1 to 500 sccm
Supply time of MS gas and PH gas: 1 to 300 minutes
$N_2$ gas supply flow rate (per gas supply pipe): 10 to 20,000 sccm
Process temperature (second temperature): 450 to 650 degrees C.
Process pressure: 30 to 400 Pa.

As the second process gas, it may be possible to use, in addition to the MS gas, various kinds of silicon hydride gases described above. Furthermore, in order to ensure that the crystal state of the Si film at a time when the Si film-forming step is completed is amorphous, it is desirable that a silicon hydride gas of lower order than the first process gas used at the seed layer-forming step be used as the second process gas. In the present embodiment, from the viewpoint of using the DS gas as the first process gas, it is desirable that the MS gas be used as the second process gas.

As the dopant gas, it may be possible to use, in addition to the PH gas, a gas which is a group V element such as an arsine ($AsH_3$) gas or the like and which contains an element (P, arsenic (As) or the like) becoming a solid by itself. Furthermore, as the dopant gas, it may be possible to use, in addition to the gas containing a group V element, a gas which is a group III element such as a diborane ($B_2H_6$) gas, a trichloroborane ($BCl_3$) gas or the like and which contains an element (boron (B) or the like) becoming a solid by itself.

Annealing Step

After the formation of the Si film on the Si seed layer on the wafer 200 is completed, the output of the heater 207 is adjusted to change the internal temperature of the process chamber 201, i.e., the temperature of the wafer 200, to a third temperature higher than the second temperature described above, and the Si seed layer and the Si film are heat-treated (annealed). This step may be performed while opening the valves 243d to 243f and supplying an $N_2$ gas into the process chamber 201, or may be performed while closing the valves 243d to 243f and stopping the supply of the $N_2$ gas into the process chamber 201.

By performing the annealing process under processing conditions to be described later, it is possible to make the Si seed layer and the Si film in a polycrystallized state. Furthermore, before the annealing process, there are cases where the Si seed layer is in a mixed amorphous-polycrystalline state, in a polycrystalline state, and in an amorphous state. However, in any case, after the Si seed layer is polycrystallized in advance and the Si seed layer is then polycrystallized, the Si film can be polycrystallized. Thus, the Si film can be polycrystallized using the crystal grains of the Si seed layer polycrystallized in advance as nuclei. At this time, the Si film can be polycrystallized based on the crystal structure of the Si seed layer polycrystallized in advance. The grain size of the crystal grains contained in the Si film polycrystallized by performing the annealing process is influenced by the grain size of the crystal grains contained in the Si seed layer polycrystallized in advance. For example, if the grain size of the crystal grains contained in the Si seed layer polycrystallized in advance is large, the grain size of the crystal grains contained in the Si film polycrystallized by performing the annealing process tends to be increased. In addition, for example, if the grain size of the crystal grains contained in the Si seed layer polycrystallized in advance is small, the grain size of the crystal grains contained in the Si film polycrystallized by performing the annealing process tends to be reduced.

An example of the processing conditions at this step is as follows:

$N_2$ gas supply flow rate (per gas supply pipe): 0 to 20,000 sccm
Process temperature (third temperature): 700 to 1,000 degrees C.
Process pressure: 0.1 to 100,000 Pa
Process time: 1 to 300 minutes.

After-Purge and Atmospheric Pressure Return

After the polycrystallization of Si film formed on the wafer 200 is completed, the $N_2$ gas as a purge gas is supplied from the respective nozzles 249a to 249c into the process chamber 201 and is exhausted from the exhaust port 231a. Thus, the interior of the process chamber 201 is purged and the gas or the reaction byproduct, which remains in the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

Boat Unloading and Wafer Discharging

The seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging).

(3) Effects According to the Present Embodiment

According to the present embodiment, one or more effects as set forth below may be achieved.

(a) By controlling the thickness of the Si seed layer formed at the seed layer-forming step, it is possible to indirectly adjust at least one selected from the group of the crystal grain size and the surface roughness of the Si film after the annealing at the annealing step.

As described above, at the seed layer-forming step, the Si seed layer in an amorphous state is formed. Thereafter, at the Si film-forming step, the Si film in an amorphous state is formed. Thereafter, the Si film is polycrystallized by performing the annealing step. In that process, the Si seed layer is polycrystallized in advance and the Si film is then polycrystallized. At the annealing step, the Si film is polycrystallized based on the crystal structure of an underlying layer, i.e., the crystal structure of the Si seed layer polycrystallized in advance.

In this case, as described above, by increasing the thickness of the Si seed layer formed at the seed layer-forming step, the grain size of the crystal grains contained in the Si seed layer polycrystallized in advance can be adjusted to be increased. As a result, it is possible to adjust and increase the grain size of the crystal grains contained in the Si film polycrystallized by performing the annealing step, based on the grain size of the crystal grains of the Si seed layer polycrystallized in advance. In addition, by increasing the thickness of the Si seed layer formed at the seed layer-forming step, it is possible to adjust and reduce the surface roughness (RMS) of the Si film polycrystallized by performing the annealing step. As the grain size of the crystal grains contained in the polycrystallized Si film is increased, the density of grain boundaries existing per unit area of the surface of the polycrystallized Si film is reduced, which is considered as one factor to affect the above. Furthermore, the term "surface roughness" may refer to the degree of roughness of surface. The expression "surface roughness is small" may mean that the surface is smooth.

In addition, as described above, by reducing the thickness of the Si seed layer formed at the seed layer-forming step, the grain size of the crystal grains contained in the Si seed layer polycrystallized in advance can be adjusted to be reduced. As a result, it is possible to adjust and reduce the grain size of the crystal grains contained in the Si film polycrystallized by performing the annealing step, based on the grain size of the crystal grains of the Si seed layer polycrystallized in advance. Furthermore, by reducing the thickness of the Si seed layer formed at the seed layer-forming step, it is possible to adjust and increase the surface roughness of the Si film polycrystallized by performing the annealing step. As the grain size of the crystal grains contained in the polycrystallized Si film is reduced, the density of grain boundaries existing per unit area of the surface of the polycrystallized Si film is increased, which is considered as one factor to affect the above.

(b) By controlling the thickness of the Si seed layer formed at the seed layer-forming step, it is possible to indirectly adjust the electrical characteristics of the Si film after the annealing at the annealing step.

As described above, by increasing the thickness of the Si seed layer formed at the seed layer-forming step, it is possible to adjust and increase the grain size of the crystal grains contained in the Si film after the annealing, and to adjust and reduce the density of grain boundaries existing per unit area of the surface of the Si film. In addition, by increasing the thickness of the Si seed layer formed at the seed layer-forming step, it is possible to adjust and reduce the surface roughness of the Si film after the annealing. As a result of these, it is possible to adjust and reduce the electric resistance of the Si film in the in-plane direction of the wafer 200, i.e., in the direction along the surface, after the annealing.

Furthermore, as described above, by reducing the thickness of the Si seed layer formed at the seed layer-forming step, it is possible to adjust and reduce the grain size of the crystal grains contained in the Si film after the annealing, and to adjust and increase the density of grain boundaries existing per unit area of the surface of the Si film. In addition, by reducing the thickness of the Si seed layer formed at the seed layer-forming step, it is possible to adjust and increase the surface roughness of the Si film after the annealing. As a result of these, it is possible to adjust and increase the electrical resistance of the Si film in the direction along the surface after the annealing.

(c) According to the present embodiment, by controlling the thickness of the Si seed layer formed at the seed layer-forming step, it is possible to freely adjust the crystal grain size, the surface roughness and the electrical characteristic of that film regardless of the thickness of the finally formed Si film. On the other hand, in the case of not using the method according to the present embodiment, it is difficult to freely adjust the crystal grain size, the surface roughness and the electrical characteristic of the Si film formed on the wafer 200 regardless of the thickness of that film. For example, in the case of not using the method according to the present embodiment, it is necessary to increase the thickness of the Si film itself formed on the wafer 200 in order to increase the crystal grain size of the Si film, to reduce the surface roughness, or to reduce the electrical resistance in the direction along the surface.

(d) In the present embodiment, by polycrystallizing the Si seed layer in advance and then polycrystallizing the Si film, i.e., by generating a predetermined time difference at the timing of polycrystallizing each of the Si seed layer and the Si film, various effects described above can be achieved.

Here, as in the present embodiment, by heating the Si seed layer in an amorphous state formed by using the DS gas which is a silicon hydride gas of higher order than the MS gas at the second temperature, it is possible to allow at least part of the Si seed layer in an amorphous state to become in a state of being easily polycrystallized regardless of whether it is to be polycrystallized or not to be polycrystallized. On the other hand, the Si film formed by using the MS gas which is a silicon hydride gas of lower order than the DS gas is in an amorphous state at the second temperature, and then polycrystallized only by being heated to the third temperature higher than the second temperature, i.e., by performing the annealing step. As described above, the temperature for polycrystallization differs between the film (or layer) formed by using the DS gas and the film (or layer) formed by using the MS gas. Therefore, as in the present embodiment, the time difference described above is reliably generated and thus various effects described above can be reliably achieved by appropriately selecting the type of the process gas used at each step such that the process gas (first silicon hydride gas) used at the seed layer-forming step becomes a silicon hydride gas of higher order than the process gas (second silicon hydride gas) used at the Si film-forming step.

In addition, as in the present embodiment, when the polycrystallization of the Si seed layer formed on the wafer 200 firstly starts at the temperature-rising step prior to starting the step of forming the Si film, or at the Si film-forming step, the time difference described above is reliably generated and thus various effects described above can be reliably achieved. Furthermore, at the temperature-rising step prior to starting the Si film-forming step, when it waits for a predetermined time until the internal temperature of the process chamber 201 reaches the second temperature and is stabilized, the polycrystallization of the Si seed layer is more reliably to proceed, the aforementioned time difference is more reliably generated, and various effects described above can be more reliably achieved.

(e) When the seed layer-forming step is performed after preparing the wafer 200 and prior to performing the Si film-forming step, it is possible to shorten the incubation time (growth delay) of the Si film formed on the wafer 200 and to improve the productivity of the film-forming process.

(f) By alternately performing the supply of the DCS gas and the supply of the DS gas at the seed layer-forming step, it is possible to enhance the formation efficiency of the Si seed layer and to densify the Si seed layer. Thus, it is possible to enhance the productivity of the film-forming process and to densify the Si film formed on the wafer 200. Furthermore, by alternately performing the supply of the gases, it is possible to suppress an excessive gas phase reaction in the process chamber 201 and to improve the quality of the film-forming process.

(g) By controlling the balance between the flow rate of the $N_2$ gas supplied from the nozzle 249a and the flow rate of the $N_2$ gas supplied from the nozzle 249b at the Si film-forming step, it is possible to adjust the wafer in-plane film thickness distribution of the Si film formed on the wafer 200. For example, as illustrated in FIG. 4, by setting the flow rate of the $N_2$ gas supplied from the nozzle 249a larger than the flow rate of the $N_2$ gas supplied from the nozzle 249b, it is possible to control the aforementioned film thickness distribution (central concave distribution), which tends to be the thinnest at the central portion of the surface of the wafer 200 and to be gradually thickened as it gets closer to the outer peripheral portion so as to become a distribution (flat distribution) in which the thickness becomes equal between the central portion and the outer peripheral portion of the surface of wafer 200 or a distribution (central convex distribution) which is the thickest at the central portion of the surface of the wafer 200 and gradually thinned as it gets closer to the outer peripheral portion.

(h) The effects mentioned above can be similarly achieved in the case where the first process gas other than the DS gas is used, or in the case where the halogen-containing gas other than the DCS gas is used, or in the case where the second process gas other than the MS gas is used, or in the case where the dopant gas other than the PH gas is used, or in the case where the inert gas other than the $N_2$ gas is used.

(4) Exemplary Modifications

The film-forming step of the present embodiment is not limited to the one illustrated in FIG. 4 but may be modified as in the modifications described below. These modifications may be arbitrarily combined. Unless stated otherwise, the processing procedures and processing conditions at each step of each modification may be similar to the processing procedures and processing conditions at each step of the aforementioned substrate processing sequence.

Modification 1

As in the substrate processing sequence illustrated below, at the seed layer-forming step, the Si seed layer may be formed by supplying, a predetermined number of times (n times, where n is an integer of 1 or more), an aminosilane-based gas such as a tetrakis-dimethylaminosilane ($Si[N(CH_3)_2]_4$, abbreviation: 4DMAS) gas, a tris-dimethylaminosilane ($Si[N(CH_3)_2]_3H$, abbreviation: 3DMAS) gas, a bis-diethylaminosilane ($Si[N(C_2H_5)_2]_2H_2$, abbreviation: BDEAS) gas, a bis-tert-butylaminosilane ($SiH_2[NH(C_4H_9)]_2$: BTBAS) gas, a diisopropylaminosilane ($SiH_3N[CH(CH_3)_2]_2$, abbreviation: DIPAS) gas or the like to the wafer 200. Even in this modification, the same effects as those of the aforementioned embodiment may be achieved.

Modification 2

As in the substrate processing sequence illustrated below, at the seed layer-forming step, the Si seed layer may be formed by supplying a halosilane gas such as an HCDS gas or the like to the wafer 200 a predetermined number of times (n times, where n is an integer of 1 or more). Even in this modification, the same effects as those of the aforementioned embodiment may be achieved.

Modification 3

As in the substrate processing sequence illustrated below, at the seed layer-forming step, the Si seed layer may be formed by supplying a silicon hydride gas such as a DS gas to the wafer 200 a predetermined number of times (n times, where n is an integer of 1 or more). Even in this modification, the same effects as those of the aforementioned embodiment may be achieved.

Modification 4

As in the substrate processing sequence illustrated below, at the seed layer-forming step, the Si seed layer may be formed by alternately supplying a Si-free halogen-based gas such as an HCl gas, a $Cl_2$ gas or the like and a silicon hydride gas such as a DS gas or the like to the wafer 200 a predetermined number of times (n times, where n is an integer of 1 or more). Even in this modification, the same effects as those of the aforementioned embodiment may be achieved.

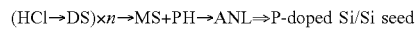
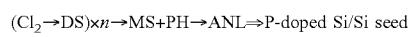

Other Embodiments

While one embodiment of the present disclosure has been specifically described above, the present disclosure is not limited to the aforementioned embodiment but may be variously modified without departing from the spirit of the present disclosure.

In the aforementioned embodiment, there has been described an example in which a series of steps from the seed layer-forming step to the annealing step are performed in the same process chamber 201 (in-situ). However, the present disclosure is not limited to the aforementioned embodiment. For example, a series of steps from the seed layer-forming step to the Si film-forming step may be performed in-situ, and thereafter, the annealing step may be performed in another process chamber (ex-situ). Even in this case, the same effects as those of the aforementioned embodiment may be achieved.

Furthermore, for example, another film-forming step of forming a film (a silicon oxide film, a silicon nitride film, or the like) other than the Si film may be performed between the Si film-forming step and the annealing step. In this case, a series of steps from the seed layer-forming step to the annealing step, i.e., a series of steps including another film-forming step may be performed in the same process chamber (first process chamber). In addition, a series of steps from the seed layer-forming step to the Si film-forming step is performed in the same process chamber (first process chamber), and a series of steps from another film-forming step to the annealing step may be performed in another process chamber (second process chamber). Furthermore, a series of steps from the seed layer-forming step to the Si film-forming step is performed in the same process chamber (first process chamber), another film-forming step is performed in another process chamber (second process chamber), and the annealing step may be additionally performed in another process chamber (third process chamber) or in the first process chamber. Even in these cases, the same effects as those of the aforementioned embodiment may be achieved.

In various cases described above, if the series of steps are performed in-situ, the wafer 200 will not be exposed to the air during the process, and the process may be performed consistently while the wafer 200 is under vacuum, thereby performing stable substrate processing. In addition, if some steps are performed ex-situ, it is possible to set the internal temperature of each process chamber in advance to, for example, the process temperature at each step or a temperature close thereto, to shorten the time required for temperature regulation, and to improve the production efficiency.

In the aforementioned embodiment, there has been described an example in which the nozzles 249a to 249c are installed adjacently (proximally), but the present disclosure is not limited to the aforementioned embodiment. For example, the nozzles 249a and 249c may be installed at a position apart from the nozzle 249b in a space with an annular plan-view shape between the inner wall of the reaction tube 203 and the wafers 200. Even in this case, the same effects as those of the aforementioned embodiment may be achieved.

In the aforementioned embodiment, there has been described an example in which the first to third supply parts are configured by the nozzles 249a to 249c, and the three nozzles are installed in the process chamber 201. However, the present disclosure is not limited to the aforementioned embodiment. For example, at least one selected from the group of the first to third supply parts may be configured by two or more nozzles. In addition, a nozzle other than the first to third supply parts may be newly installed in the process chamber 201, and the $N_2$ gas or various kinds of process gases may be further supplied using this nozzle. In the case where the nozzle other than the nozzles 249a to 249c is installed in the process chamber 201, the newly installed nozzle may be installed at a position facing the exhaust port 231a as viewed from the plane, or may be installed at a position not facing it. That is, the newly installed nozzle may be installed at a position away from the nozzles 249a to 249c, for example, at an intermediate position between the nozzles 249a to 249c and the exhaust port 231a or at a position near the intermediate position along the outer periphery of the wafers 200 in a space with an annular plan-view shape between the inner wall of the reaction tube 203 and the wafers 200. Even in these cases, the same effects as those of the aforementioned embodiment may be achieved.

In the aforementioned embodiment, there has been described an example in which the P-doped Si film is formed on the Si seed layer, but the present disclosure is not limited to the aforementioned embodiment. For example, a Si film not doped with a dopant such as P, i.e., a non-doped Si film, may be formed on the Si seed layer according to the substrate processing sequence illustrated below. Even in this case, the same effects as those of the aforementioned embodiment may be achieved.

(DCS→DS)×n→MS→ANL⇒Si/Si seed

In the aforementioned embodiment, there has been described an example in which a film containing Si as a main element on a substrate, but the present disclosure is not limited to the aforementioned embodiment. That is, the present disclosure may be suitably applied to a case where a film containing a semi-metal element such as germanium (Ge) or the like other than Si as a main element is formed on a substrate. For example, a Ge film or a SiGe film may be formed as the film containing Ge. In these cases, a Ge seed layer or a SiGe seed layer may be formed instead of the Si seed layer. In the case where a Ge film or a SiGe film is formed, it may be possible to use, for example, a monogermane ($GeH_4$, abbreviation: MG) gas or an MS gas. In the case where a Ge seed layer or a SiGe layer is formed, it may be possible to use, for example, a digermane ($Ge_2H_6$, abbreviated: DG) gas or a DS gas. These films may be formed by, for example, the substrate processing sequences illustrated below, and the processing conditions at that time may be similar to the processing conditions of the aforementioned embodiment. Even in these cases, the same effects as those of the aforementioned embodiment may be achieved.

(DCS→DS)×n→MG→ANL⇒Ge/Si seed (DCS→DG)×n→MG→ANL⇒Ge/Ge seed (DCS→DS→DG)×n→MG→ANL⇒Ge/SiGe seed (DCS→DS)×n→MS+MG→ANL⇒SiGe/Si seed (DCS→DG)×n→MS+MG→ANL⇒SiGe/Ge seed (DCS→DS→DG)×n→MS+MG→ANL⇒SiGe/SiGe seed (DCS→DS)×n→MG+PH→ANL⇒P-doped Ge/Si seed (DCS→DG)×n→MG+PH→ANL⇒P-doped Ge/Ge seed (DCS→DS→DG)×n→MG+PH→ANL⇒P-doped Ge/SiGe seed (DCS→DS)×n→MS+MG+PH→ANL⇒P-doped
SiGe/Si seed (DCS→DG)×n→MS+MG+PH→ANL⇒P-doped
SiGe/Ge seed (DCS→DS→DG)×n→MS+MG+PH→ANL⇒P-doped SiGe/SiGe seed Recipes used in substrate processing may be prepared individually according to the processing contents and may be stored in the memory device 121c via a telecommunication line or the external memory device 123. Moreover, at the start of processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

Figure 5A:
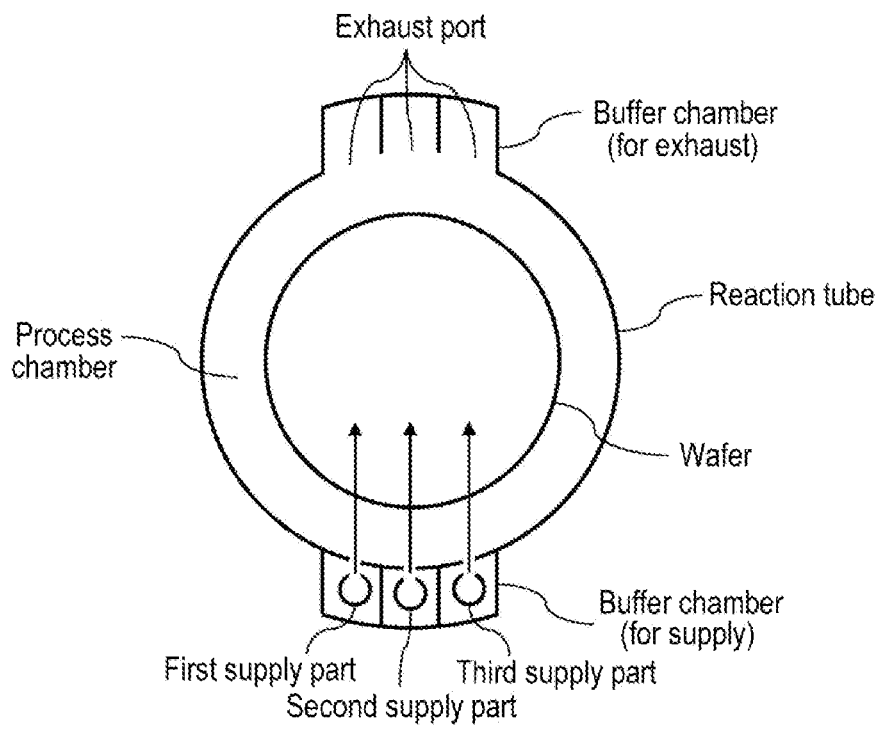
FIGS. 5A and 5B are cross sectional views illustrating exemplary modifications of the vertical process furnace, in which a reaction tube, a buffer chamber, nozzles and the like are partially extracted and shown.
Figure 5B:
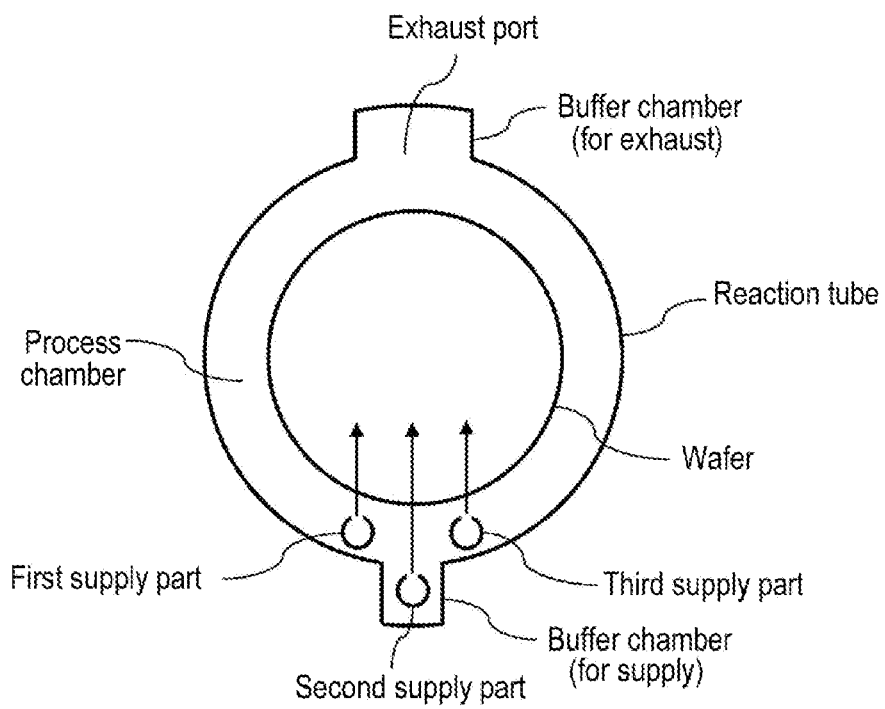

In the aforementioned embodiment, there has been described an example in which the first to third supply parts are installed in the process chamber along the inner wall of the reaction tube. However, the present disclosure is not limited to the aforementioned embodiment. For example, as illustrated in a cross sectional structure of a vertical type process furnace in FIG. 5A, a buffer chamber is installed on the sidewall of the reaction tube, and the first to third supply parts having the same configuration as the aforementioned embodiment may be installed in the same arrangement as the aforementioned embodiment. FIG. 5A illustrates an example in which a buffer chamber for supply and a buffer chamber for exhaust are installed on the sidewall of the reaction tube, and these chambers are respectively arranged at oppose positions with the wafers interposed therebetween. In addition, each of the buffer chamber for supply and the buffer chamber for exhaust is installed between the lower portion of the sidewall of the reaction tube and the upper portion thereof, i.e., along the wafer arrangement region. Furthermore, FIG. 5A illustrates an example in which the buffer chamber for supply is partitioned into a plurality of (three) spaces, and each supply part is disposed in each space. The arrangement of the three spaces of the buffer chamber is similar to the arrangement of the first to third supply parts. In addition, for example, as illustrated in a cross sectional structure of a vertical type process furnace in FIG. 5B, a buffer chamber is installed in the same arrangement as that of FIG. 5A, a second supply part is installed in the buffer chamber, and the first and third supply parts may be installed so as to sandwich a communication part of this buffer chamber with the process chamber between both sides along the inner wall of the reaction tube. The configurations other than the buffer chamber and the reaction tube described with reference to FIGS. 5A and 5B are similar to the configuration of each part of the process furnace illustrated in FIG. 1. Even in the case of using these process furnaces, the same effects as those of the aforementioned embodiment may be achieved.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

In the case of using these substrate processing apparatuses, a film-forming process may be performed by the processing sequences and processing conditions similar to those of the embodiments and modifications described above. Effects similar to those of the embodiments and modifications described above may be achieved.

The embodiments, modifications and the like described above may be appropriately combined with one another. The processing procedures and processing conditions at this time may be similar to, for example, the processing procedures and processing conditions of the aforementioned embodiment.

Example

A Si seed layer and a Si film were sequentially formed on a wafer, and thereafter, the Si film was polycrystallized by performing the aforementioned annealing step according to the film-forming sequence illustrated in FIG. 4 using the substrate processing apparatus illustrated in FIG. 1. As in the aforementioned embodiment, in this example, the Si seed layer was polycrystallized in advance and the Si film was then polycrystallized. The processing conditions at each step were set to predetermined conditions which fall within the processing condition range described in the aforementioned embodiment. The thickness of the Si seed layer was set to 6.5 Å, 8 Å, 12.2 Å, and 13 Å.

Figure 6:
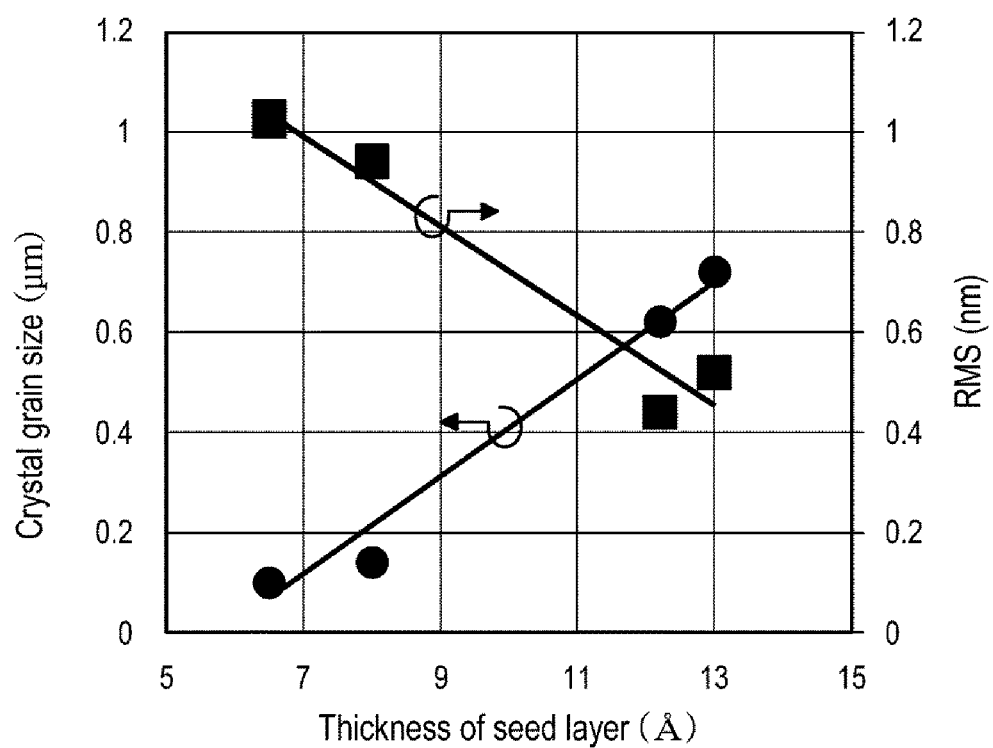
FIG. 6 is a diagram illustrating measurement results of a crystal grain size and a surface roughness of a silicon film after annealing.

Then, a crystal grain size and a surface roughness of the polycrystallized Si film were measured. FIG. 6 illustrates measurement results of a crystal grain size and a surface roughness (RMS) of the polycrystallized Si film. In FIG. 6, the horizontal axis indicates a thickness (Å) of the Si seed layer, and the vertical axis on the left side indicates a grain size (μm) of crystal grains constituting the Si film and the vertical axis on the right side indicates an RMS (nm) of surface of the Si film measured by an atomic force microscope (AFM). In the drawing, the symbol ● indicates a grain size, and the symbol ■ indicates an RMS. According to FIG. 6, it can be seen that, by increasing the thickness of the Si seed layer, it is possible to adjust the grain size of the Si film to be increased and adjust the RMS to be reduced. On the other hand, it is understood that, by reducing the thickness of the Si seed layer, it is possible to adjust the grain size of the Si film to be reduced and adjust the RMS to be increased.

According to the present disclosure in some embodiments, it is possible to adjust a quality of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) forming a seed layer on a substrate by supplying a first process gas to the substrate at a first temperature;
   (b) forming a film on the seed layer by supplying a second process gas to the substrate at a second temperature; and
   (c) annealing the seed layer and the film at a third temperature,
   wherein at least one selected from the group of a crystal grain size and a surface roughness of the film after performing the annealing in (c) is adjusted by controlling a thickness of the seed layer formed in (a), and
   wherein the seed layer is polycrystallized in advance in (b) or (c), and then the film is polycrystallized in (c).

2. The method according to claim 1, wherein the seed layer in an amorphous state is formed in (a), and
   wherein the film in an amorphous state is formed in (b).

3. The method according to claim 2, wherein when the seed layer is polycrystallized in advance in (c), in (b), the seed layer that is an underlying layer of the film is maintained in an amorphous state, or at least a portion of the seed layer is polycrystallized.

4. The method according to claim 2, wherein when the seed layer is polycrystallized in advance in (c), in (b), the seed layer that is an underlying layer of the film is maintained in an amorphous state, or the seed layer is changed to be in a mixed amorphous-polycrystalline state.

5. The method according to claim 1, wherein in (c), the film is polycrystallized based on a crystal structure of the seed layer polycrystallized in advance.

6. The method according to claim 1, wherein in (c), the film is polycrystallized by using crystal grains of the seed layer polycrystallized in advance as nuclei.

7. The method according to claim 1, wherein the seed layer includes a silicon seed layer, and the film includes a silicon film, and
   wherein the first process gas includes a first silicon hydride, the second process gas includes a second silicon hydride, and the first silicon hydride is a silicon hydride of higher order than the second silicon hydride.

8. The method according to claim 7, wherein the first process gas includes disilane, and the second process gas includes monosilane.

9. The method according to claim 1, wherein the second temperature is higher than the first temperature, and the third temperature is higher than the second temperature.

10. The method according to claim 1, wherein in (a), the thickness of the seed layer is controlled by controlling at least one selected from the group of a process temperature and a process time.

11. The method according to claim 1, wherein in (a), the seed layer is formed by performing a cycle a predetermined number of times, the cycle including non-simultaneously performing:
    supplying a halogen-containing gas to the substrate; and
    supplying the first process gas to the substrate,
    wherein the thickness of the seed layer is controlled by controlling the number of times of performing the cycle.

12. The method according to claim 1, wherein in (a), the seed layer is formed by performing a cycle a predetermined number of times, the cycle including non-simultaneously performing:
    supplying a halogen-containing gas to the substrate; and
    supplying the first process gas to the substrate.

13. The method according to claim 1, wherein the seed layer includes a silicon seed layer, and
    wherein the first process gas includes a halosilane gas, an aminosilane gas, or a disilane gas.

14. The method according to claim 1, wherein (a), (b), and (c) are performed in a same process chamber.

15. The method according to claim 1, wherein (a) and (b) are performed in a same process chamber, and
    wherein (b) and (c) are performed in different process chambers.

16. The method according to claim 15, wherein the film is a silicon film, and
    wherein the method further comprises forming a film other than the silicon film on the silicon film, between (b) and (c).

17. The method according to claim 16, wherein the film other than the silicon film includes a silicon oxide film.

18. A substrate processing apparatus comprising:
    a process chamber in which a substrate is processed;
    a first process gas supply system configured to supply a first process gas to the substrate in the process chamber;
    a second process gas supply system configured to supply a second process gas to the substrate in the process chamber;
    a temperature regulator configured to regulate a temperature of the substrate in the process chamber; and
    a controller configured to control the first process gas supply system, the second process gas supply system, and the temperature regulator so as to perform a process in the process chamber, the process comprising:
    (a) forming a seed layer on the substrate by supplying the first process gas to the substrate at a first temperature;
    (b) forming a film on the seed layer by supplying the second process gas to the substrate at a second temperature; and
    (c) annealing the seed layer and the film at a third temperature,
    wherein at least one selected from the group of a crystal grain size and a surface roughness of the film after the annealing in (c) is adjusted by controlling a thickness of the seed layer formed in (a), and
    wherein the seed layer is polycrystallized in advance in (b) or (c), and then the film is polycrystallized in (c).

19. A non-transitory computer-readable recording medium storing a program that causes, by a computer, a substrate processing apparatus to perform a process in a process chamber of the substrate processing apparatus, the process comprising:
    (a) forming a seed layer on a substrate by supplying a first process gas to the substrate at a first temperature;
    (b) forming a film on the seed layer by supplying a second process gas to the substrate at a second temperature; and
    (c) annealing the seed layer and the film at a third temperature, wherein at least one selected from the group of a crystal grain size and a surface roughness of the film after the annealing in (c) is adjusted by controlling a thickness of the seed layer formed in (a), and wherein the seed layer is polycrystallized in advance in (b) or (c), and then the film is polycrystallized in (c).

* * * * *